US008945963B2

(12) United States Patent
Sekiya

(10) Patent No.: US 8,945,963 B2
(45) Date of Patent: Feb. 3, 2015

(54) OPTICAL DEVICE PROCESSING METHOD

(71) Applicant: Disco Corporation, Tokyo (JP)

(72) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/909,511

(22) Filed: Jun. 4, 2013

(65) Prior Publication Data

US 2013/0330869 A1    Dec. 12, 2013

(30) Foreign Application Priority Data

Jun. 12, 2012  (JP) ................................. 2012-132746

(51) Int. Cl.
*H01L 21/00*    (2006.01)
*H01L 33/20*    (2010.01)
*H01L 33/00*    (2010.01)

(52) U.S. Cl.
CPC .............. *H01L 33/20* (2013.01); *H01L 33/007* (2013.01); *H01L 33/0095* (2013.01)
USPC ............. 438/42; 438/33; 438/460; 438/462; 438/463; 257/E21.001

(58) Field of Classification Search
USPC ......................................... 438/44
See application file for complete search history.

(56) References Cited

U.S. PATENT DOCUMENTS

| 7,446,344 | B2 * | 11/2008 | Fehrer et al. ..................... 257/95 |
| 7,795,126 | B2 | 9/2010 | Prabhu et al. |
| 8,497,146 | B2 | 7/2013 | Odnoblyudov et al. |
| 8,653,547 | B2 | 2/2014 | Jeong et al. |
| 2003/0151064 | A1 * | 8/2003 | Ohno et al. ..................... 257/192 |
| 2003/0209772 | A1 | 11/2003 | Prabhu |
| 2005/0250234 | A1 * | 11/2005 | Kamikawa et al. ............. 438/47 |
| 2006/0154389 | A1 | 7/2006 | Doan |
| 2008/0035949 | A1 | 2/2008 | Fudeta et al. |
| 2009/0218590 | A1 | 9/2009 | Cai et al. |
| 2009/0267100 | A1 | 10/2009 | Miyake et al. |
| 2010/0283075 | A1 | 11/2010 | McKenzie et al. |
| 2011/0128980 | A1 * | 6/2011 | Kato ......................... 372/43.01 |
| 2011/0284911 | A1 | 11/2011 | Chiang |
| 2012/0326178 | A1 * | 12/2012 | Fehrer et al. ..................... 257/88 |
| 2013/0330856 | A1 | 12/2013 | Sekiya |

FOREIGN PATENT DOCUMENTS

| JP | 04-010670 | 1/1992 |
| JP | 08-330629 | 12/1996 |
| JP | 2011-044471 | 3/2011 |

* cited by examiner

*Primary Examiner* — Angel Roman
(74) *Attorney, Agent, or Firm* — Greer Burns & Crain Ltd.

(57) ABSTRACT

An optical device processing method including: a groove forming step of forming a plurality of grooves on a front side of a sapphire substrate; a film forming step of forming an epitaxial film on the front side of the sapphire substrate after performing the groove forming step, thereby forming a plurality of optical devices and a plurality of crossing division lines for partitioning the optical devices; and a dividing step of dividing the sapphire substrate with the epitaxial film along the division lines after performing the film forming step, thereby obtaining a plurality of individual optical device chips.

4 Claims, 6 Drawing Sheets

OPTICAL DEVICE PROCESSING METHOD

BACKGROUND OF THE INVENTION

1. Field of the Invention

The present invention relates to a processing method for an optical device composed of a sapphire substrate and an epitaxial film formed on the sapphire substrate.

2. Description of the Related Art

A nitride semiconductor such as gallium nitride (GaN) has a wide bandgap and allows the emission of blue light, so that it is widely used for the manufacture of LED (Light Emitting Diode) and LD (Laser Diode). A general gallium nitride based light emitting diode has a structure composed of a sapphire substrate, a buffer layer of a gallium nitride based compound such as AlGaN formed on the sapphire substrate, an n-GaN layer formed on the buffer layer, a light emitting layer (MQW: Multiple Quantum Well structure) of a GaN/InGaN layer formed on the n-GaN layer, and a p-GaN layer formed on the light emitting layer (see Japanese Patent No. 3250438, for example).

Such an epitaxial film of gallium nitride is formed on the front side of the sapphire substrate, and the back side of the sapphire substrate (opposite to the epitaxial film) is next ground by using a grinding apparatus as disclosed in Japanese Patent Laid-open No. 2011-044471, for example, thereby reducing the thickness of the sapphire substrate to a predetermined thickness. Thereafter, the sapphire substrate is divided into individual optical devices by using a laser processing apparatus or a cutting apparatus.

SUMMARY OF THE INVENTION

However, when the epitaxial film of gallium nitride is formed by epitaxial growth on the sapphire substrate, warpage occurs on the sapphire substrate after forming the epitaxial film due to the difference in coefficient of thermal expansion and lattice constant between gallium nitride and sapphire. The amount of this warpage increases with an increase in diameter of the sapphire substrate.

The occurrence of warpage of the sapphire substrate causes a problem such that the sapphire substrate cannot be held under suction in transporting the sapphire substrate in a subsequent step and that the sapphire substrate may be broken in holding the sapphire substrate on a chuck table under suction in a thickness reducing step or a dividing step. To cope with this problem, it is considered to preliminarily set the thickness of the sapphire substrate to a thickness large enough to withstand the warpage occurring after forming the epitaxial film, e.g., 2 mm or more. However, when the thickness of the sapphire substrate is set to such a large thickness, e.g., 2 mm or more, there arises a problem such that it is very difficult to reduce the thickness of the sapphire substrate or divide the sapphire substrate and that much time is required for such processing.

It is therefore an object of the present invention to provide an optical device processing method which can prevent the occurrence of warpage of the sapphire substrate.

In accordance with an aspect of the present invention, there is provided an optical device processing method including: a groove forming step of forming a plurality of grooves on a front side of a sapphire substrate; a film forming step of forming an epitaxial film on the front side of the sapphire substrate after performing the groove forming step, thereby forming a plurality of optical devices and a plurality of crossing division lines for partitioning the optical devices; and a dividing step of dividing the sapphire substrate with the epitaxial film along the division lines after performing the film forming step, thereby obtaining a plurality of individual optical device chips.

Preferably, the grooves to be formed in the groove forming step are respectively aligned with the division lines to be formed in the film forming step. Preferably, the sapphire substrate has a diameter of 8 inches or more and a thickness of 1 mm or less.

According to the optical device processing method of the present invention, the epitaxial film is formed after forming the grooves on the front side of the sapphire substrate. Accordingly, the grooves formed on the front side function to relieve stress due to the difference in coefficient of thermal expansion or lattice constant between the sapphire substrate and the epitaxial film, thereby preventing the occurrence of warpage of the sapphire substrate after forming the epitaxial film. Accordingly, handling of the sapphire substrate in the subsequent step can be easily carried out and possible damage to the sapphire substrate can be reduced in holding the sapphire substrate under suction. Further, since the occurrence of warpage of the sapphire substrate even after forming the epitaxial film can be prevented, the thickness of the sapphire substrate can be set to 1 mm or less, for example. Accordingly, the sapphire substrate can be easily reduced in thickness and divided. Furthermore, the thickness to be removed by grinding can be reduced, thereby contributing to environmental friendliness.

The above and other objects, and features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
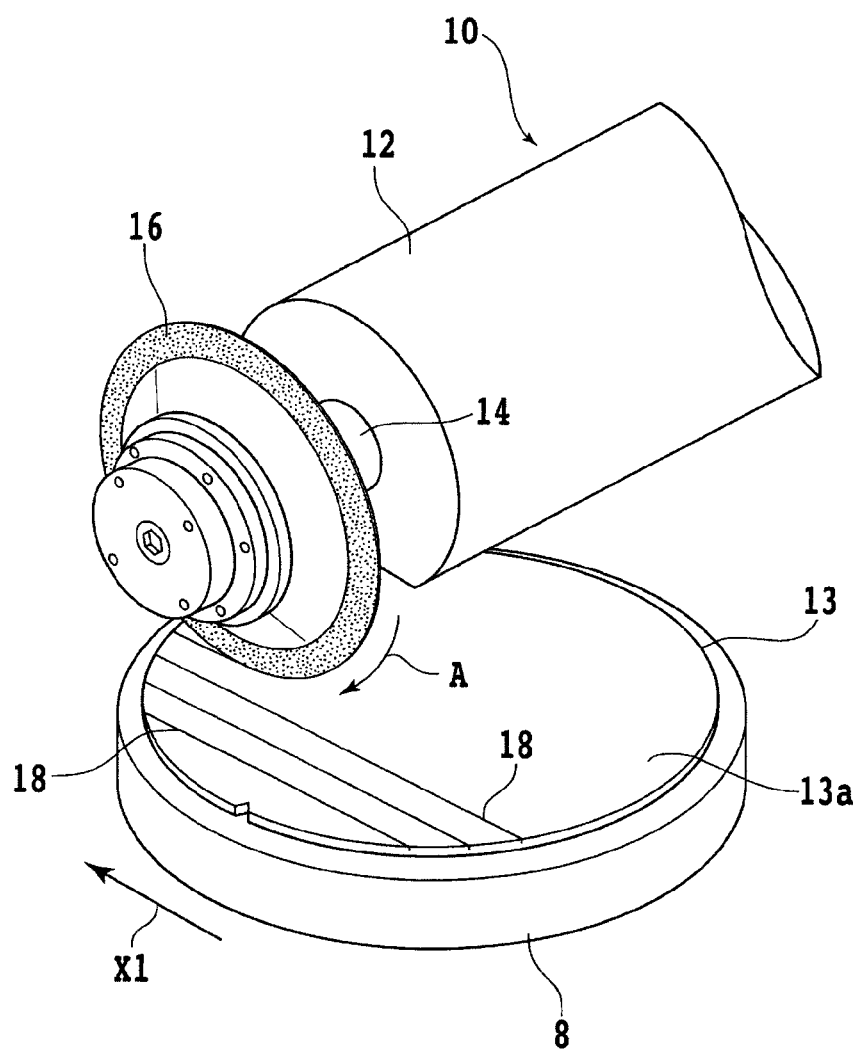
FIG. 1 is a perspective view showing a groove forming step.

Preferred embodiments of the present invention will now be described in detail with reference to the drawings. Referring to FIG. 1, there is shown a perspective view for illustrating a groove forming step. In this groove forming step, a sapphire substrate 13 is held under suction on a chuck table 8 of a cutting apparatus. The sapphire substrate 13 has a thickness of 1 mm or less. Reference numeral 10 generally denotes a cutting unit included in the cutting apparatus. The cutting unit 10 includes a spindle housing 12, a spindle 14 adapted to be rotationally driven by a motor (not shown) provided in the spindle housing 12, and a cutting blade 16 mounted on a front end portion of the spindle 14.

In this groove forming step, the cutting blade 16 is rotated at high speeds in a direction shown by an arrow A in FIG. 1 and moved to cut into the sapphire substrate 13 at a predetermined depth from a front side 13a of the sapphire substrate 13. In this condition, the chuck table 8 is fed in a direction shown by an arrow X1 in FIG. 1 to thereby form a groove 18 having the predetermined depth on the front side 13a of the sapphire substrate 13. This groove forming step is similarly repeated to form a plurality of grooves 18 extending in a first direction over the entire surface on the front side 13a of the sapphire substrate 13. Thereafter, the chuck table 8 is rotated at a predetermined angle (e.g., 70 to 90 degrees), and the groove forming step is similarly repeated to form a plurality of grooves 18 extending in a second direction intersecting the first direction at the predetermined angle over the entire surface on the front side 13a of the sapphire substrate 13. The grooves 18 extending in the first direction may be equally spaced from each other and the grooves 18 extending in the second direction may be also equally spaced from each other. It is to be noted, however, that the spacing between any adjacent ones of the grooves 18 is arbitrary. It is sufficient that the grooves 18 are to be uniformly formed over the entire surface on the front side 13a of the sapphire substrate 13.

Figure 2:
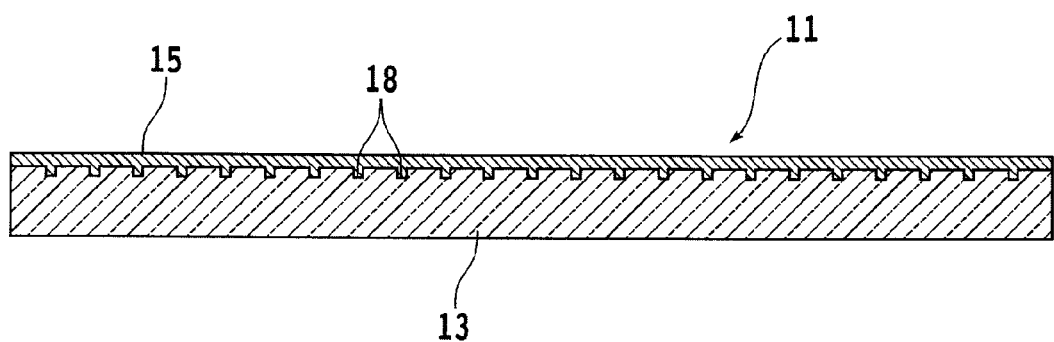
FIG. 2 is a vertical sectional view of an optical device wafer in a condition after performing a film forming step.
Figure 3:
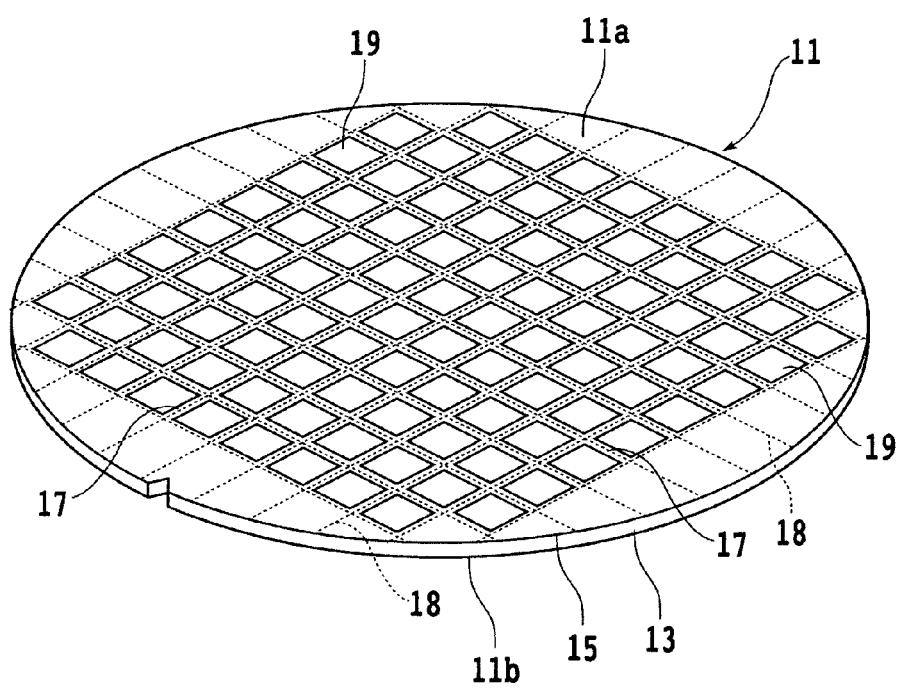
FIG. 3 is a perspective view of the optical device wafer as viewed from a front side thereof, showing a condition that grooves formed in the groove forming step are respectively aligned with division lines formed in the film forming step.

After performing the groove forming step mentioned above, a film forming step is performed as shown in FIGS. 2 and 3 in such a manner that an epitaxial film 15 is formed on the front side 13a of the sapphire substrate 13 to thereby form a plurality of optical devices 19 and a plurality of crossing division lines 17 for partitioning the plural optical devices 19. Preferably, the grooves 18 to be formed in the groove forming step are respectively aligned with the division lines 17 to be formed on the epitaxial film 15 in the film forming step. That is, in this film forming step, the epitaxial film 15 is formed so that the division lines 17 extend along the grooves 18 formed in the groove forming step as shown in FIG. 3.

In this manner, the epitaxial film 15 having the plural optical devices 19 and the plural crossing division lines 17 for partitioning the optical devices 19 is formed on the front side 13a of the sapphire substrate 13, thereby forming an optical device wafer 11 as shown in FIG. 3. The optical device wafer 11 has a front side 11a having the epitaxial film 15 and a back side 11b where the sapphire substrate 13 is exposed. In the film forming step of the present invention, the epitaxial film 15 is formed after forming the plural grooves 18 on the front side 13a of the sapphire substrate 13. Accordingly, the grooves 18 function to relieve stress due to the difference in coefficient of thermal expansion or lattice constant between the sapphire substrate 13 and the epitaxial film 15, thereby preventing the occurrence of warpage of the sapphire substrate 13 after forming the epitaxial film 15.

Figure 4:
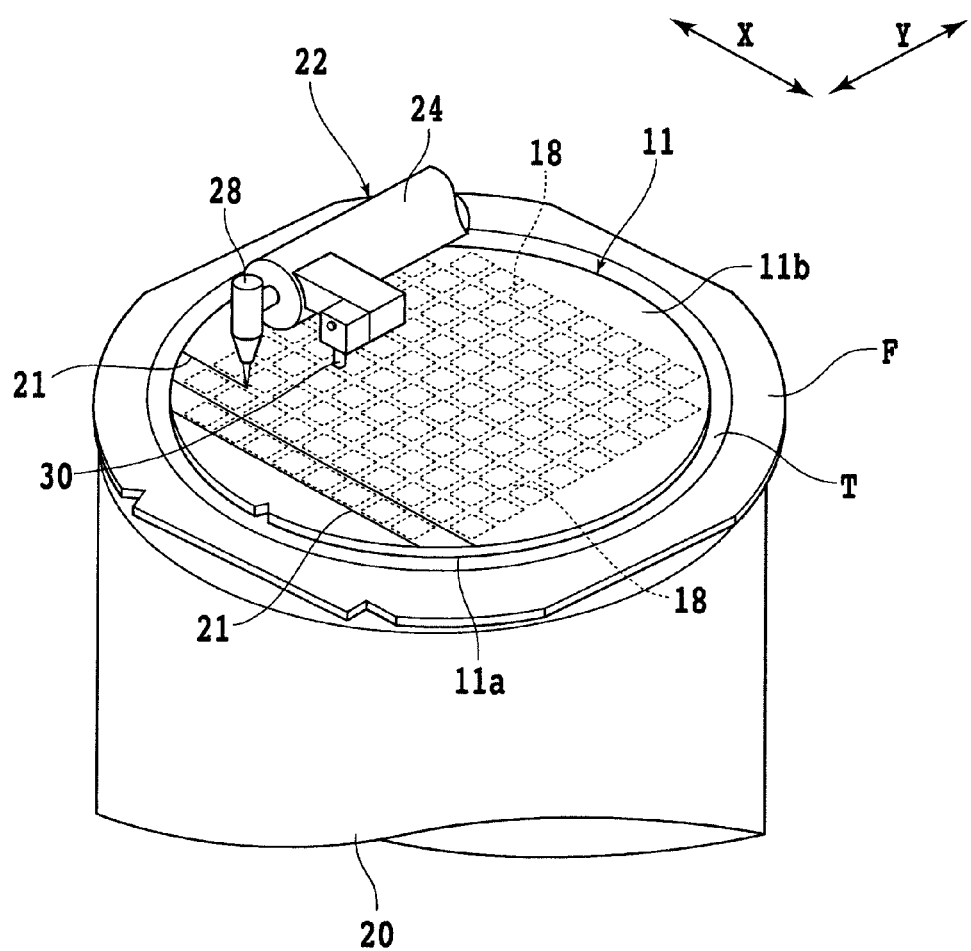
FIG. 4 is a perspective view showing a laser processed groove forming step as a preferred embodiment of a division start point forming step.

After performing the film forming step mentioned above, a division start point forming step using a laser beam is performed. In a first preferred embodiment of the division start point forming step, a laser beam having an absorption wavelength to the sapphire substrate 13 is used to perform ablation. As shown in FIG. 4, the front side 11a of the optical device wafer 11 is held under suction on a chuck table 20 of a laser processing apparatus in a condition where the back side 11b of the optical device wafer 11 is exposed. A protective tape T supported to an annular frame F is preliminarily attached to the front side 11a of the optical device wafer 11. Reference numeral 22 generally denotes a laser beam applying unit included in the laser processing apparatus. The laser beam applying unit 22 includes a housing 24, a laser beam generating unit 26 (see FIG. 5) provided in the housing 24, and a focusing unit (laser processing head) 28 mounted on a front end of the housing 24. Reference numeral 30 denotes an imaging unit having an ordinary imaging device and an infrared imaging device.

Figure 5:
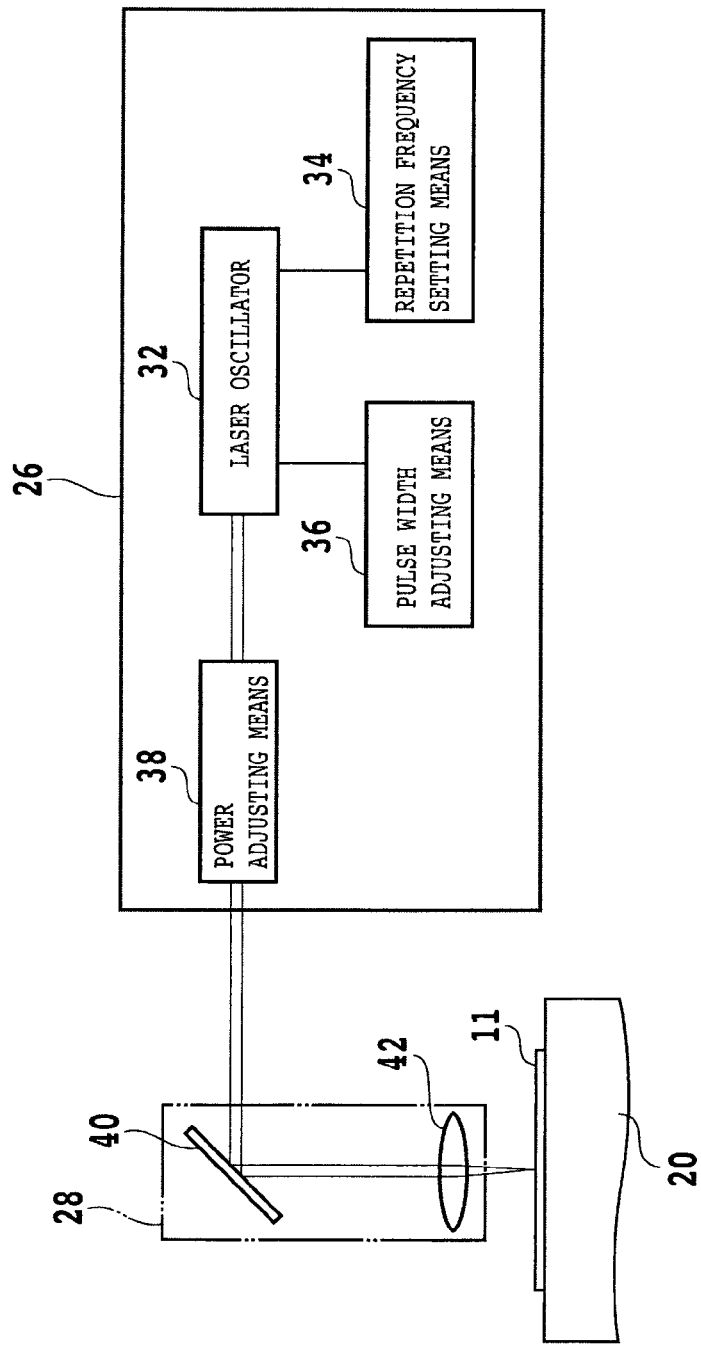
FIG. 5 is a block diagram of a laser beam applying unit.

As shown in FIG. 5, the laser beam generating unit 26 includes a laser oscillator 32 such as a YAG laser or a YVO4 laser, repetition frequency setting means 34, pulse width adjusting means 36, and power adjusting means 38. The power of a pulsed laser beam oscillated by the laser oscillator 32 is adjusted to a predetermined power by the power adjusting means 38 in the laser beam generating unit 26. The pulsed laser beam is next reflected by a mirror 40 included in the focusing unit 28 mounted on the front end of the housing 24. The pulsed laser beam is next focused by a focusing objective lens 42 included in the focusing unit 28 and applied to the optical device wafer 11 held on the chuck table 20.

Referring back to FIG. 4, the optical device wafer 11 held under suction on the chuck table 20 of the laser processing apparatus is next subjected to an alignment operation. That is, the optical device wafer 11 is imaged from the back side 11b by using the infrared imaging device in the imaging unit 30, thereby detecting an area corresponding to the division lines 17. This alignment operation is performed by using a pattern matching technique well known in the art. After performing the alignment operation, the laser beam having an absorption wavelength to the sapphire substrate 13 of the optical device wafer 11 is applied from the focusing unit 28 through the back side 11b to the front side 11a of the optical device wafer 11, thereby performing ablation to form a laser processed groove 21 as a division start point along a predetermined one of the division lines 17 extending in the first direction set parallel to an X direction.

Thereafter, this ablation is similarly performed for all the other division lines 17 extending in the first direction as sequentially indexing the chuck table 20 in a Y direction, thereby forming a plurality of laser processed grooves 21 on the front side 11a of the optical device wafer 11 along all of the division lines 17 extending in the first direction. Thereafter, the chuck table 20 is rotated 90° to similarly perform the ablation for all of the division lines 17 extending in the second direction perpendicular to the first direction, thereby forming a plurality of laser processed grooves 21 on the front side 11a of the optical device wafer 11 along all of the division lines 17 extending in the second direction.

For example, the laser processed groove forming step as the first preferred embodiment of the division start point forming step is performed under the following processing conditions.
Light source: LD pumped Q-switched Nd:YAG laser
Wavelength: 355 nm (third harmonic of YAG laser)
Pulse energy: 35 μJ
Focused spot diameter: 10 μm
Pulse width: 180 ns
Repetition frequency: 180 kHz
Work feed speed: 60 mm/s
Groove depth: 20 μm In a second preferred embodiment of the division start point forming step, a laser beam having a transmission wavelength (e.g., 1064 nm) to the sapphire substrate 13 is applied to the optical device wafer 11 from the back side 11b in a condition where a focal point of the laser beam is set inside the sapphire substrate 13, thereby forming a modified layer as a division start point inside the sapphire substrate 13 along each division line 17. Thereafter, the optical device wafer 11 is divided along each modified layer as a division start point to obtain individual optical device chips.

As another preferred embodiment of the division start point forming step, the cutting blade 16 shown in FIG. 1 may be used to form a cut groove on the back side 11b of the optical device wafer 11 along each division line 17. Thereafter, the optical device wafer 11 may be divided along each cut groove as a division start point to obtain individual optical device chips. As a modification, the optical device wafer 11 may be fully cut (completely cut) by using a cutting blade or a laser beam.

Figure 6:
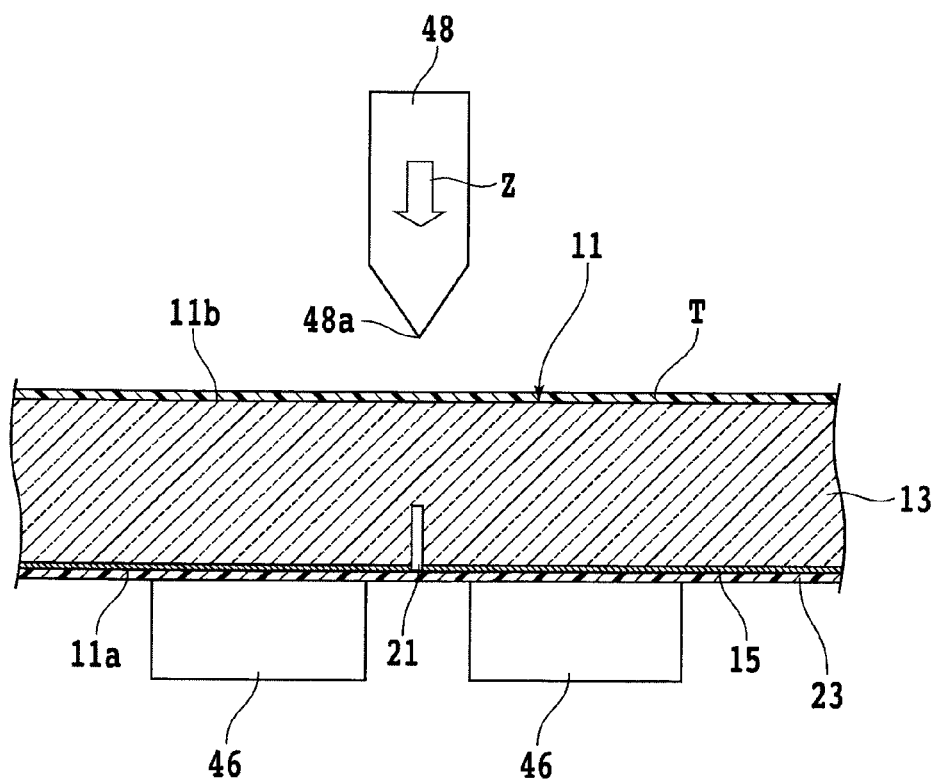
FIG. 6 is a partially sectional side view showing a dividing step.

After performing the division start point forming step of forming the laser processed grooves 21 as shown in FIG. 4, a dividing step is performed to divide the optical device wafer 11 into individual optical device chips. Prior to performing this dividing step, a contact prevention sheet 23 for protecting the epitaxial film 15 is provided on the front side 11a of the optical device wafer 11 as shown in FIG. 6. The dividing step is performed in the following manner. The optical device wafer 11 is placed on a pair of support beds 46 spaced a predetermined distance from each other in a condition where the front side 11a of the optical device wafer 11 is oriented downward and a predetermined one of the plural laser processed grooves 21 is positioned between the pair of support beds 46. Thereafter, a wedge-shaped dividing bar 48 having a sharp edge 48a is lowered in a direction shown by an arrow Z in FIG. 6 to press the back side 11b of the optical device wafer 11. At this time, the predetermined laser processed groove 21 is positioned directly below the dividing bar 48. Accordingly, the optical device wafer 11 is broken along the predetermined laser processed groove 21 as a division start point by the pressure of the dividing bar 48. For example, the dividing bar 48 is driven by using an air cylinder or the like.

After breaking the optical device wafer 11 along the predetermined laser processed groove 21, the optical device wafer 11 is moved in a lateral direction as viewed in FIG. 6 by one pitch of the laser processed grooves 21 to thereby position the next laser processed groove 21 between the pair of support beds 46. Thereafter, the dividing bar 48 is driven to break the optical device wafer 11 along this laser processed groove 21 as a division start point. This dividing step is similarly performed along all of the other division lines 17 extending in the first direction. Thereafter, the optical device wafer 11 is rotated 90° to similarly perform the dividing step along all of the division lines 17 extending in the second direction perpendicular to the first direction. Thus, the optical device wafer 11 is divided into individual optical device chips.

In this preferred embodiment, the pair of support beds 46 and the dividing bar 48 are fixed in their lateral positions and the optical device wafer 11 is movable in the lateral direction as viewed in FIG. 6. As a modification, the optical device wafer 11 may be fixed in its lateral position and the support beds 46 and the dividing bar 48 may be movable in the lateral direction as viewed in FIG. 6 with the pitch of the division lines 17.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device processing method comprising:
a groove forming step of forming a plurality of grooves on a front side of a sapphire substrate;
a film forming step of forming an epitaxial film on the front side of the sapphire substrate after performing the groove forming step, thereby forming a plurality of optical devices and a plurality of crossing division lines for partitioning the optical devices, said grooves relieving stresses due to the difference in coefficient of thermal expansion or lattice constant between the sapphire substrate and the epitaxial film, thereby preventing the occurrence of warpage of the sapphire substrate;
a division start point forming step of forming division start points along the crossing division lines; and
a dividing step of dividing the sapphire substrate with the epitaxial film along the division lines after performing the division start point forming step, thereby obtaining a plurality of individual optical device chips.

2. The optical device processing method according to claim 1, wherein the grooves to be formed in the groove forming step are respectively aligned with the division lines to be formed in the film forming step.

3. The optical device processing method according to claim 1, wherein the sapphire substrate has a diameter of 8 inches or more and a thickness of 1 mm or less.

4. The optical device processing method according to claim 1, wherein said grooves are filled by said epitaxial film completely in said film forming step.

* * * * *